(12) United States Patent
Aden

(10) Patent No.: US 7,131,093 B1
(45) Date of Patent: Oct. 31, 2006

(54) METHODS AND APPARATUS FOR CREATING A PROGRAMMABLE LINK DELAY

(75) Inventor: Steven George Aden, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/348,883

(22) Filed: Feb. 7, 2006

(51) Int. Cl.
*G06F 17/50* (2006.01)

(52) U.S. Cl. ............................................. 716/6; 703/19

(58) Field of Classification Search .................... 716/6; 703/19
See application file for complete search history.

(56) References Cited

U.S. PATENT DOCUMENTS 6,611,936 B1    8/2003    Jue et al.

*Primary Examiner*—Evan Pert
(74) *Attorney, Agent, or Firm*—Dugan & Dugan

(57) ABSTRACT

In a first aspect, a first method of creating a programmable link delay during cycle simulation of a system is provided. The first method includes the steps of (1) modeling a system for cycle simulation, wherein the system includes (a) a plurality of links; (b) link transmitting logic adapted to transmit data on the plurality of links; (c) link receiving logic adapted to receive data from the plurality of links; and (d) link training logic coupled to the link receiving logic and adapted to compensate for skew between links; and (2) employing delay logic, coupled to the plurality of links, in the modeled system to create a known skew between links during cycle simulation. Numerous other aspects are provided.

20 Claims, 3 Drawing Sheets

(12)  US 7,131,093 B1

METHODS AND APPARATUS FOR CREATING A PROGRAMMABLE LINK DELAY

FIELD OF THE INVENTION

The present invention relates generally to computer systems, and more particularly to methods and apparatus for creating a programmable link delay.

BACKGROUND

A cycle simulation tool (simulator) may be employed to test logic included in paths of an integrated circuit (IC) without considering propagation delay (e.g., introduced by wires and logic included in the path). In contrast, a timing simulator may be employed to account for timing while testing logic included in paths of the IC. However, owning and maintaining both a cycle simulator and timing simulator may be cost-prohibitive. For example, the cost of a timing simulator may prevent an owner of a cycle simulator from purchasing the timing simulator. Further, even if purchased, a large amount of time may be required to customize the timing simulator for the owner's intended application. Additionally, in some conventional systems, an array and pointers may be employed to simulate propagation delays in the system. However, maintaining the pointers may require a large amount of time and/or resources. Consequently, methods and apparatus for considering delay introduced by a logic path of an IC while testing the IC using a cycle simulator are desired.

SUMMARY OF THE INVENTION

In a first aspect of the invention, a first method of creating a programmable link delay during cycle simulation of a system is provided. The first method includes the steps of (1) modeling a system for cycle simulation, wherein the system includes (a) a plurality of links; (b) link transmitting logic adapted to transmit data on the plurality of links; (c) link receiving logic adapted to receive data from the plurality of links; and (d) link training logic coupled to the link receiving logic and adapted to compensate for skew between links; and (2) employing delay logic, coupled to the plurality of links, in the modeled system to create a known skew between links during cycle simulation.

In a second aspect of the invention, a first apparatus for creating a programmable link delay during cycle simulation of a system is provided. The first apparatus includes a computer and a cycle simulation tool executed by the computer. The cycle simulation tool is adapted to (1) model a system for cycle simulation, wherein the system includes (a) a plurality of links; (b) link transmitting logic adapted to transmit data on the plurality of links; (c) link receiving logic adapted to receive data from the plurality of links; and (d) link training logic coupled to the link receiving logic and adapted to compensate for skew between links; and (2) employ delay logic, coupled to the plurality of links, in the modeled system to create a known skew between links during cycle simulation.

In a third aspect of the invention, a first computer program product is provided. The first computer program product includes a medium readable by a computer. The computer readable medium has computer program code adapted to (1) model a system for cycle simulation, wherein the system includes (a) a plurality of links; (b) link transmitting logic adapted to transmit data on the plurality of links; (c) link receiving logic adapted to receive data from the plurality of links; and (d) link training logic coupled to the link receiving logic and adapted to compensate for skew between links; and (2) employ delay logic, coupled to the plurality of links, in the modeled system to create a known skew between links during cycle simulation. Numerous other aspects are provided, as are systems and apparatus in accordance with these and other aspects of the invention.

Other features and aspects of the present invention will become more fully apparent from the following detailed description, the appended claims and the accompanying drawings.

DETAILED DESCRIPTION

The present invention may provide improved methods and apparatus for testing an IC. More specifically, the present invention may provide delay logic adapted to introduce a programmable propagation delay in one or more logic paths of an IC (e.g., links included therein) during testing by a cycle simulator. The logic may include chains of registers, corresponding to the logic paths, which may be employed to introduce known delays to the paths, respectively, during testing. In this manner, a known skew may be established between such paths. The IC may include or be coupled to path training logic adapted to compensate for skew between the one or more logic paths. Therefore, the known skew created by the delay logic of the present methods and apparatus may be employed to test (e.g., ensure proper functioning of) the path training logic.

Because the delay logic may be employed by a cycle simulator to account for propagation delay while testing logic of an IC, an owner of the cycle simulator may not need a timing tool to test the IC, and may thereby avoid the cost of purchasing and customizing the timing tool. Further, because the delay logic employs latches (e.g., combined to form registers), the delay logic may not be required to maintain pointers like the conventional systems described above, and therefore, avoid overhead associated therewith. In this manner, the present invention may provide improved methods and apparatus for testing an IC.

Figure 1:
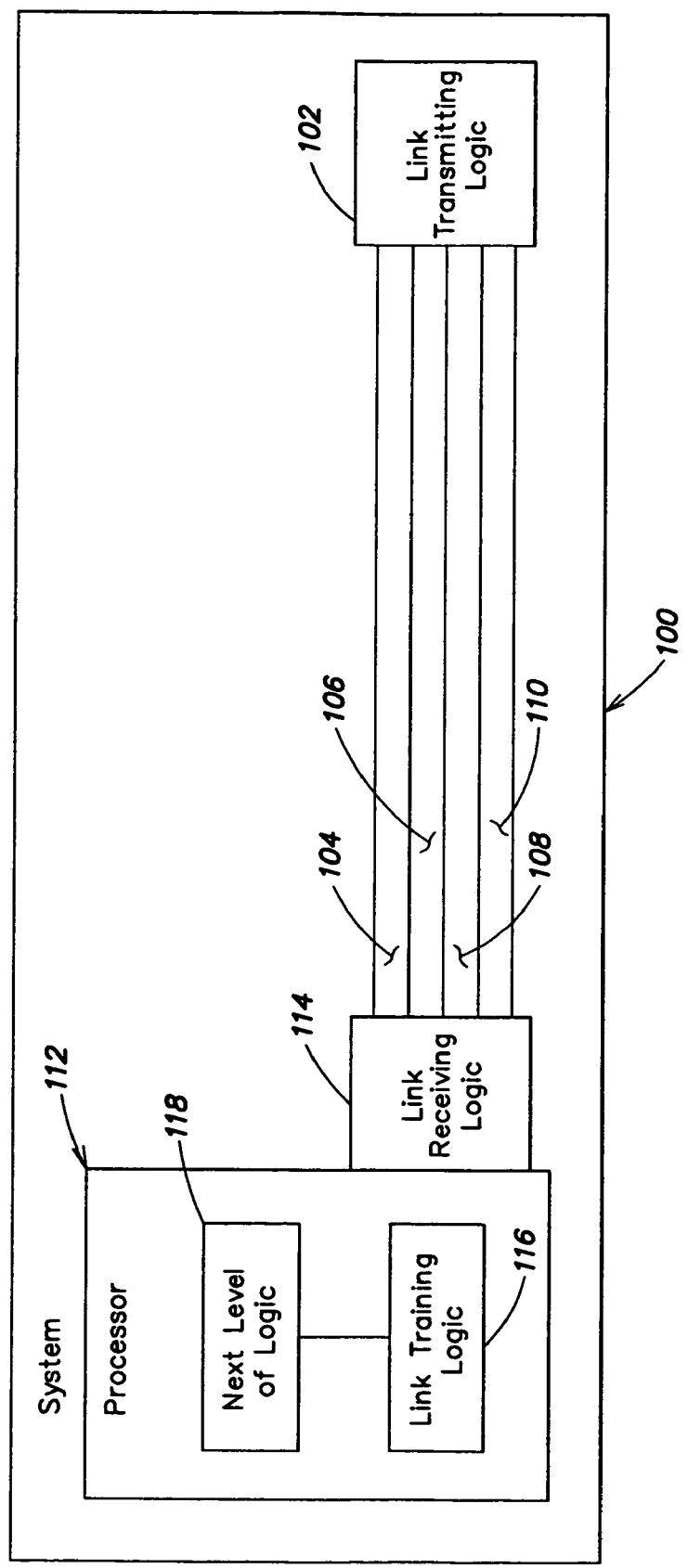
FIG. 1 is a block diagram of a system that may be tested using cycle simulation in accordance with an embodiment of the present invention.

FIG. 1 is a block diagram of a system 100 that may be tested using cycle simulation in accordance with an embodiment of the present invention. With reference to FIG. 1, the system 100 may include link transmitting logic 102 coupled to a plurality of links 104–110. The link transmitting logic 102 may be adapted to transmit data onto the plurality of links 104–110. The link transmitting logic 102 may be an input/output (I/O) device or the like. Each link 104–110 may be adapted to transmit eight bits (e.g., a byte) of data at a time. However, one or more of the links 104–110 may be adapted to transmit a larger or smaller amount of data at a time. Further, the system 100 may include a processor 112 coupled to the plurality of links 104–110 via link receiving logic 114. The processor 112 may be the Cell Broadband Engine manufactured by the assignee of the present invention, IBM Corporation of Armonk, N.Y. (although another processor may be employed). The link receiving logic 114 may be adapted to receive data from the plurality of links 104–110 and transmit such data to the processor 112. Although not shown, the system 100 may include additional links coupled to the processor 112 on which the processor 112 may transmit data.

During operation, respective data transmitted on the plurality of links 104–110 by the link transmitting logic 102 at the same time may not arrive in the link receiving logic 114 at the same time due to propagation delay in one or more of the links 104–110. The propagation delay may be caused by a difference in wire lengths of the different links 104–110, for example. However, such a delay may be caused by other reasons. The propagation delay in one or more of the links 104–110 may cause skew between links 104–110. Consequently, the processor 112 may include link training logic 116 adapted to detect and compensate for such skew between links 104–110. For example, the link training logic 116 may be adapted to compensate for a skew of a maximum predetermined size (e.g., a predetermined number of units of time) between links 104–110. Thus, the link training logic 116 may align the skewed data, which was transmitted on the links 104–110 at the same time, when such data is received by the processor 116. The link training logic 116 may be coupled to a next level of logic 118 adapted to receive and process the aligned data. The system 100 described above is exemplary, and therefore, the system 100 may be configured in a different manner. For example, a larger or smaller amount of and/or different logic may be employed for the system 100.

If the data received from the links 104–110 is not properly aligned by the link training logic 116, such data may not be useful to the next level of logic 118. Consequently, the link training logic 116 may be tested to ensure proper functioning thereof. More specifically, operation of the system 100 may be tested using a simulation tool. The present methods and apparatus enable a cycle simulation tool, which typically tests logic in paths or links of a system without considering propagation delays of such paths or links, to account for such propagation delays. Consequently, an owner of the cycle simulation tool may not be required to purchase and customize a timing simulation tool to account for propagation delays while testing logic in paths or links of the system.

Figure 2:
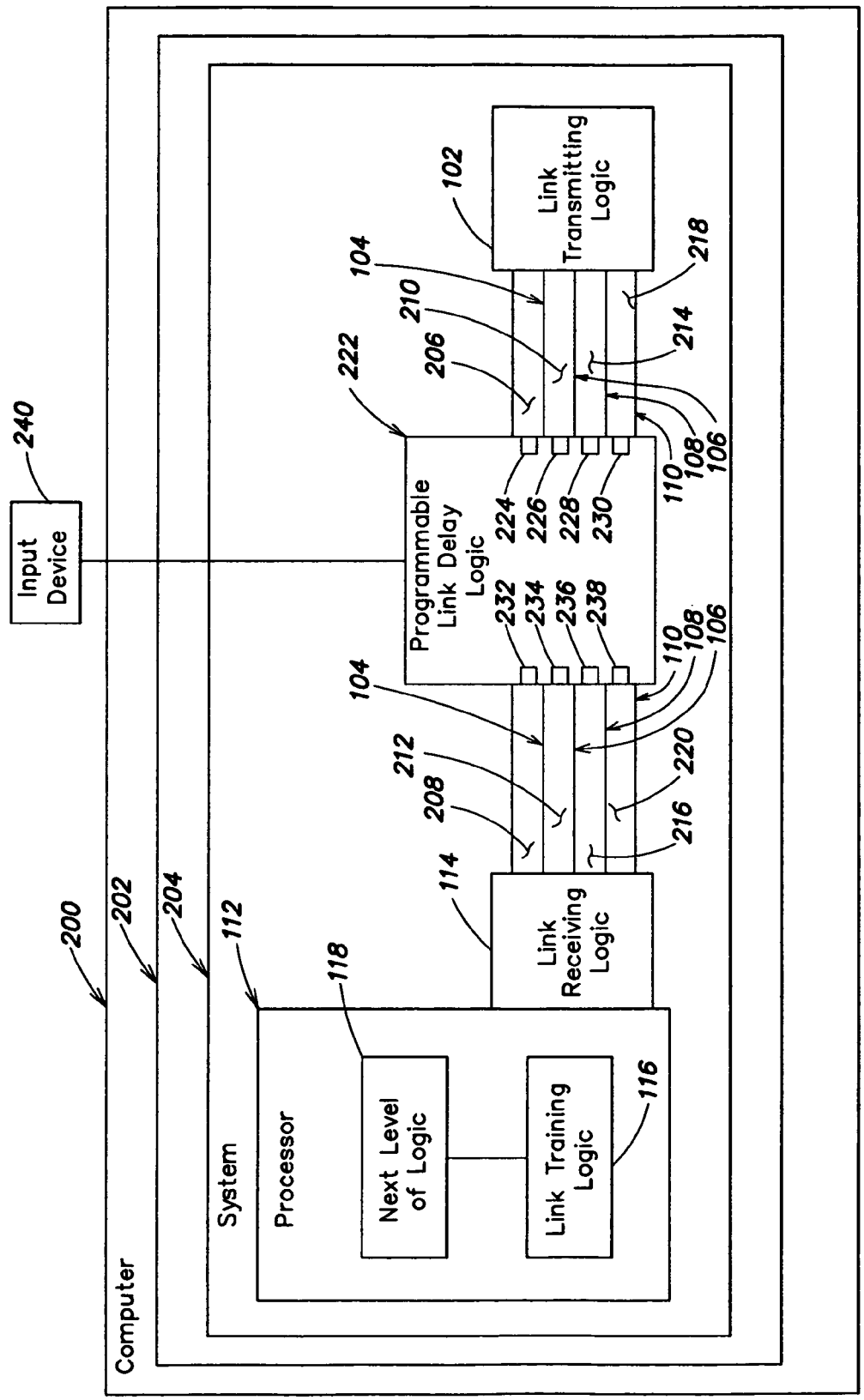
FIG. 2 illustrates a model of the system of FIG. 1 including programmable delay logic adapted to create a programmable link delay during cycle simulation in accordance with an embodiment of the present invention.

FIG. 2 illustrates a model of the system 100 of FIG. 1 including programmable delay logic adapted to create a programmable link delay during cycle simulation in accordance with an embodiment of the present invention. With reference to FIG. 2, a computer 200 or similar device may be employed to execute a cycle simulation tool 202. The cycle simulation tool 202 may be employed to create a model 204 of the system 100 and simulate operation thereof. In some embodiments, the cycle simulation tool 202 may be included in a computer program product. The model 204 may include a simulated version of the link transmitting logic 102, processor 112, link receiving logic 114, link training logic 116 and/or next level of logic 118. Further, the model 204 may include a simulated version of the links 104–110. However, each link 104–110 may be divided into a plurality of portions. For example, the simulated version of the first link 104 may include a first and second portion 206–208, the simulated version of the second link 106 may include a first and second portion 210–212, the simulated version of the third link 108 may include a first and second portion 214–216 and the simulated version of the fourth link 110 may include a first and second portion 218–220.

Additionally, the model 204 may include programmable link delay logic 222 coupled to the simulated version of the links 104–110 such that the programmable link delay logic 222 is between the link transmitting logic 102 and link receiving logic 114. More specifically, the first portions 206, 210, 214, 218 of the links 104–110 may be coupled to the programmable link delay logic 222 such that the first portions 206, 210, 214, 218 are between the link transmitting logic and respective inputs 224–230 of the programmable link delay logic 222. Similarly, the second portions 208, 212, 216, 220 of the links 104–110 may be coupled to the programmable link delay logic 222 such that the second portions 208, 212, 216, 220 are between respective outputs 232–238 of the programmable link delay logic 222 and the link receiving logic 114. The programmable link delay logic 222 may be adapted to create a known delay (e.g., propagation delay) in one or more of the links 104–110 during cycle simulation such that a known skew between links 104–110 occurs during the simulation. For example, the link transmitting logic 102 may transmit respective data on the first portions 206, 210, 214, 218 of the links 104–110 at the same time. The link transmitting logic 102 may transmit the same known pattern of data on each of the first portions 206, 210, 214, 218 of the links 104–110 at the same time. Such data may be input by the programmable link delay logic 222 via inputs 224–230. The programmable link delay logic 222 may delay data received from one or more of the first portions 206, 210, 214, 218 of the links 104–110 by desired amounts of time, respectively, and output such data via respective outputs 232–238 onto the second portions 208, 212, 216, 220 of the links 104–110. In this manner, such data may be received by the processor 112 via the second portions 208, 212, 216, 220 of the links 104–110 with a programmable known skew during the cycle simulation. The programmable link delay logic 222 may be adapted to create a skew of less than or approximately equal to the maximum predetermined size for which the link training logic 116 may compensate.

Because the skew between links 104–110 is known during the cycle simulation, the link training logic 116 may be tested during the cycle simulation. More specifically, the cycle simulation tool 202 may determine whether the link training logic 116 is able to compensate for the known skew between links 104–110 created by the programmable link delay logic 222. In this manner, the programmable link delay logic 222 in the model 204 may enable the cycle simulation tool 202 to account for propagation delays while testing logic in paths or links 104–110 in the system model 204. VHDL (VHSIC Hardware Description Language, where VHSIC is an acronym for Very High-Speed Integrated Circuits) as described in IEEE 1076 or another suitable language may be employed to design the system 100 including the programmable link delay logic 222 and such design may be compiled to form the model 204.

Additionally, an input device 240 may be adapted to provide delay signals to the programmable link delay logic 222 of the model 204. The delay signals may indicate respective delays to be applied to the simulated version of the plurality of links 104–110 during cycle simulation. The programmable link delay logic 222 may be adapted to create the known skew based on the delay signals, thereby programming the skew. The input device 240 may be a computer different than that employed to execute the cycle simulation tool 202. Alternatively, the input device 240 may be the computer 200 or included therein.

Figure 3:
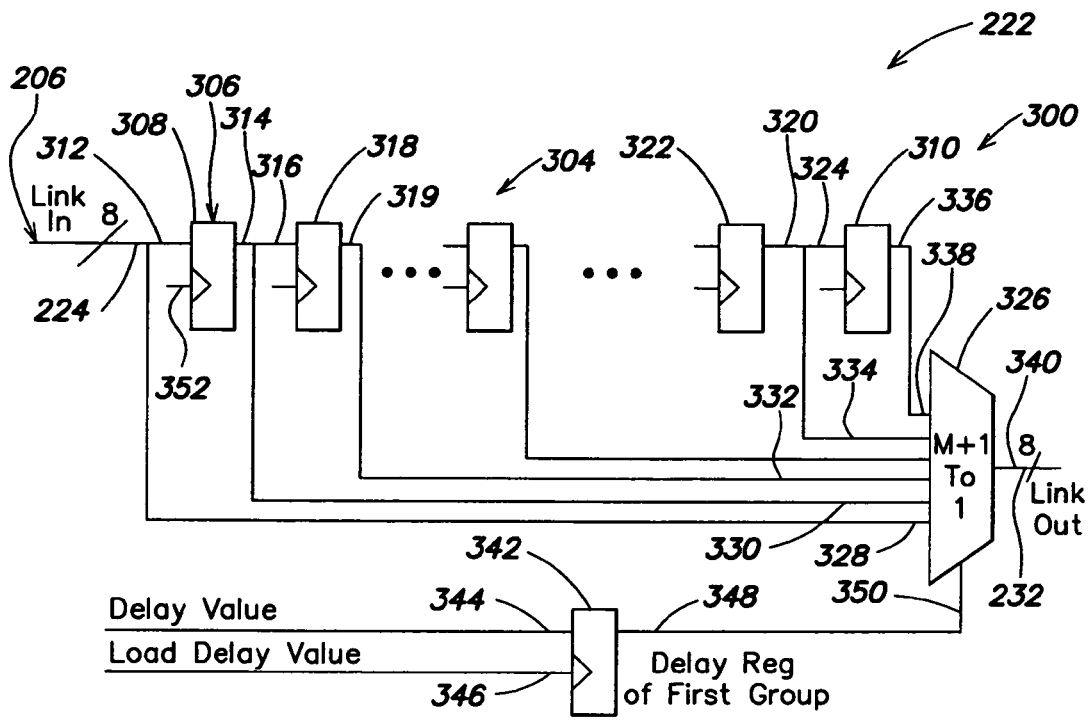
FIG. 3 illustrates exemplary programmable delay logic included in the model of FIG. 2 in accordance with an embodiment of the present invention.
Figure 3:
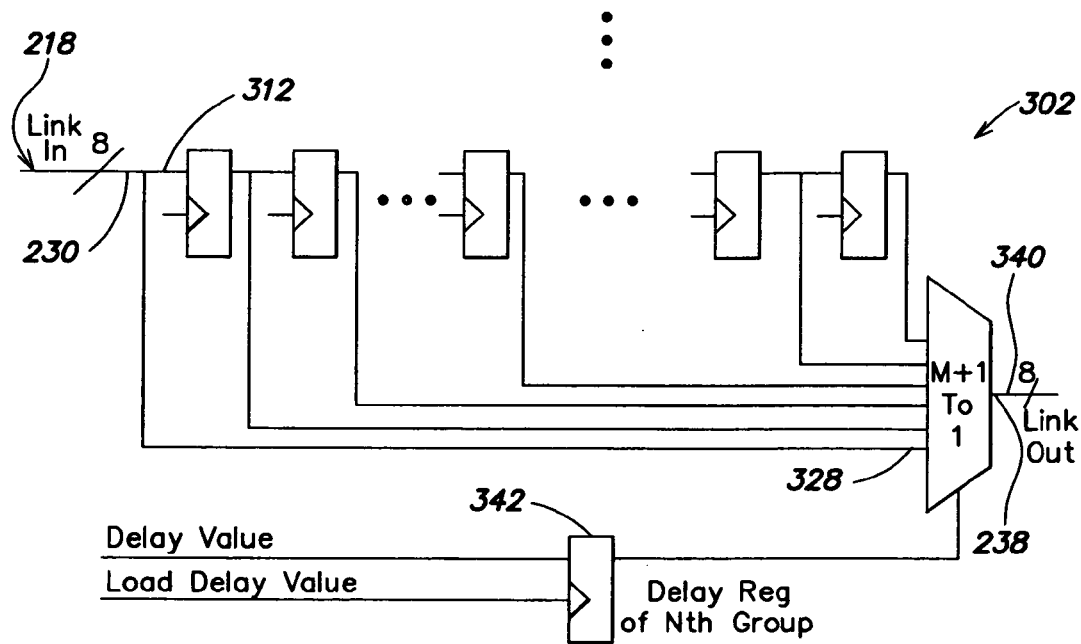

FIG. 3 illustrates exemplary programmable delay logic 222 included in the model of FIG. 2 in accordance with an embodiment of the present invention. With reference to FIG. 3, the programmable delay logic 222 may include 1 to N groups of logic each of which includes a chain of registers serving as a first-in, first-out buffer (FIFO). The number of groups of logic may correspond to the number of links 104–110 simulated in the model 202. Therefore, in the model 202 of the system 100, four groups of logic may be employed. However, for convenience, only the first and last (e.g., Nth) group 300, 302 of logic are shown. Each group of logic 300, 302 may be adapted to create and insert a programmable propagation delay in the simulated version of the link 104–110 corresponding thereto.

For example, the first group 300 of logic may include a first chain 304 of registers 306. More specifically, the first chain 304 may include a first through Mth register 308, 310. The maximum propagation delay that may be created and inserted into the simulated version of the link 104–110 corresponding to a group 300, 302 of logic may be based on the number of registers 306 included in the chain 304 of that group 300, 302. For example, the delay introduced by the first chain 304 of registers 306 may be about 0 to about M units of time. The programmable link delay logic 222 may be designed such that the number of registers 306 included in each group 300, 302 of logic may create a propagation delay of less than or approximately equal to the maximum predetermined size for which the link training logic 116 may compensate.

The first group 300 of logic may be coupled via input 224 to the first portion 206 of the simulated version of the first link 104 and receive input therefrom. The size of registers 306 in the first chain 304 may be based on the amount of data transmitted on the first portion 206. For example, because eight bits of data may be transmitted on the simulated version of the first link 104, each register 306 in the first chain 304 may be 8 bits wide (although registers of a different size may be employed). More specifically, the first portion 206 of the simulated version of the first link 104 may be coupled to a data input 312 of the first register 308. An output 314 of the first register 308 may be coupled (e.g., chained) to an input 316 of a second register 318. An output 319 of the second register 318 may be coupled to an input of the next register in the chain 304, and so on, such that an output 320 of an M–1th register 322 may be coupled to an input 324 of the Mth register 310.

Additionally, the first portion 206 of the simulated version of the first link 104 may be coupled to a multiplexer 326, via a first input 328, included in the first group 300. Further, outputs of registers 306 in the first chain 304 may be coupled to respective inputs of the multiplexer 326. For example, the output 314 of the first register 308 may be coupled to a second input 330 of the multiplexer 326, an output 319 of the second register 318 may be coupled to a third input 332 of the multiplexer 326, and so on, such that an output of the M–1th register 322 may be coupled to an Mth input 334 of the multiplexer 326 and an output 336 of the Mth register 310 in the chain 304 may be coupled to an M+1th input 338 of the multiplexer 326. The multiplexer 326 may be adapted to selectively output data input via one of the inputs 328, 330, 332, 334, 338 via an output 340 of the multiplexer 326. Therefore, the multiplexer 326 may select between register outputs. The output 340 of the multiplexer 326 may serve as an output 232 of the programmable link delay logic 222 and may be coupled to the second portion 208 of the simulated version of the first link 104.

Additionally, the first group 300 of logic may include a delay register 342, a first input 344 of which may be coupled to signal Delay Value and a second input 346 of which may be coupled to signal Load Delay Value. Signal Delay Value may indicate an amount of propagation delay (e.g., wire delay) to be created and inserted into simulated the version of the first link 104 during cycle simulation and signal Load Delay Value may indicate when Delay Value is loaded into the delay register 342. An output 348 of the delay register 342 may be coupled to an M+2th input 350 (e.g., a select or control input) of the multiplexer 326 such that signal Delay Value stored by the delay register 342 may serve as a control signal for the multiplexer 326.

During each cycle simulation tool evaluation, data received in the programmable link delay logic 222 from a link 206 may sequentially progress through the chain 304 of registers 306 coupled thereto. The multiplexer 326 may selectively output, via the multiplexer output 340, data input via one of the multiplexer inputs 328, 330, 332, 334, 338. More specifically, different values stored by the delay register 342 may cause the multiplexer 326 to selectively output data output from different FIFO registers 308, 318, 322, 310, respectively, thereby selecting and simulating different delays. Because the chain 304 includes M registers 306, 0 to M delay units may be simulated. For example, if the delay register 342 stores a first value, the multiplexer 326 may output data which was input via the first input 328 therefrom. Such data may not travel through any registers 306 in the first logic group 300, and therefore, no delay may be created and inserted into the link 104 during simulation. Each register 306 in the chain 300 through which data travels before being output from the programmable link delay logic 222 may insert a link delay of one unit (e.g., a cycle simulator evaluation) during the cycle simulation. Therefore, if the delay register 342 alternatively stores a second value, the multiplexer 326 may output data which was input via the second input 330 therefrom. Such data may travel through a first register 308 in the first logic group 300, and therefore, a delay of one unit (e.g., one simulator evaluation) may be created and inserted into the link 104 during simulation. In a similar manner, the value stored in the delay register 342 may determine data that is selectively output from the multiplexer 326, thereby determining a delay created and inserted into the link 104 during simulation. As a further example, if the delay register 342 stores an M+1th value, the multiplexer 326 may output data which was input via the Mth input 338 therefrom. Such data may travel through all registers 306 in the first chain 304 such that a delay of M units (e.g., M simulator evaluations) may be created and inserted into the link 104 during simulation.

Respective clock signals may be applied to clock inputs 352 of each of the plurality of registers 306 in the first chain 304 such that during a first time period (e.g., one or more cycles), data may be stored by the first register 308 of the first chain 304, during the second time period, data may be stored by the second register 318 of the first chain 304, and so on.

The structure and function of remaining groups 302 of logic in the programmable link delay logic 222 may be similar to the first group 300. In contrast to the first group 300, an input of each remaining group 302 may be coupled to a first portion of a corresponding link 104–110, and the multiplexer output 340 of such group 302 may serve as an output 234, 236, 238 of the programmable link delay logic 222 and may be coupled to the second portion of the corresponding link 104–110. For example, the input 230 of the fourth group 302 of logic may be coupled to the first portion 218 of the simulated version of the fourth link 110 and the multiplexer output 340 of the fourth group 302 may serve as an output 238 of the programmable link delay logic 222 and may be coupled to the second portion 220 of the simulated version of the fourth link 110. Further, signals Delay Value applied to the groups 300, 302 may differ. Consequently, delay values stored by delay registers 342 of the groups 300, 302, respectively, may differ. Therefore, different delays may be created and inserted in the links 104–110 corresponding thereto. However, two or more of the groups 300, 302 may employ the same delay value. In this manner, the programmable link delay logic 222 may create a known desired skew between simulated versions of the links 104–110 during simulation. The number of registers 306 in each chain 304 or FIFO may be selected so that the maximum specified skew between links 104–110, which the link training logic 116 may compensate for, may be created.

For example, during operation a first delay value may be stored in the delay register 342 of the first group 300 such that the programmable link delay logic 222 creates a delay of one unit (e.g., one simulator evaluation cycle) in the simulated version of the first link 104, and a second delay value may be stored in the delay register 342 of the last group 302 such that the programmable link delay logic 222 creates a delay of five units (e.g., five simulator evaluation cycles) in the simulated version of the fourth link 110. In this manner, a programmable skew of four units may be created between the first and fourth links 104, 110 during the cycle simulation. Consequently, the programmable link delay logic 222 may enable the cycle simulation tool 202 to consider a skew between links 104–110 during cycle simulation.

Delay values may be selected (e.g., at the beginning of a simulation) by software either by a random algorithm or deterministically and loaded into the delay registers 342, respectively. However, another suitable method may be employed to select the delay values. A known test pattern of data, which may be defined by a link training logic specification for link training, may be applied to the simulated version of the links 104–110 such that the test pattern may be applied to the inputs 224, 226, 228, 230 of the programmable link delay logic 222. The programmable link delay logic 222 may create a known skew between links 104–110.

Because the skew between links 104–110 during the simulation is known, the link training logic 116 may be tested. More specifically, the cycle simulation tool 202 may determine whether the link training logic 116 may compensate for the known skew during the cycle simulation, thereby verifying link training logic function. Alternatively, external monitors may be employed to verify that the link training logic 116 may compensate for the manufactured skew between links 104–110, and may present the aligned data (e.g., data whose skew has been compensated for) to the next level of logic 118. Therefore, the skew between links 104–110 may not impact the next level of logic 118. It should be noted the programmable link delay logic 222 does not need to maintain arrays and pointers like the conventional method of simulating delays.

The programmable link delay logic 222 is exemplary. Therefore, a different configuration may be employed for the programmable link delay logic 222. For example, a larger or smaller amount of and/or different logic may be employed.

Through use of the present methods and apparatus a programmable link delay may be created during cycle simulation of a system. More specifically, the present invention provides methods and apparatus for (1) modeling a system for cycle simulation, wherein the system includes (a) a plurality of links; (b) link transmitting logic adapted to transmit data on the plurality of links; (c) link receiving logic adapted to receive data from the plurality of links; and/or (d) link training logic coupled to the link receiving logic and adapted to compensate for skew between links; and (2) employing delay logic, coupled to the plurality of links, in the modeled system to create a known skew between links during cycle simulation. The known skew between the links may be employed to test the link training (e.g., byte training) logic.

The MESA cycle simulator is manufactured by the assignee of the present invention. The present methods and apparatus may be employed to enable the MESA cycle simulator, which typically does not consider propagation delays (e.g., caused by wire length) during simulation of a system, to consider such delays during the simulation. For example, by modifying the existing MESA cycle simulation tool to include the programmable link delay logic 222, the modified MESA cycle simulation tool may consider propagation delays during cycle simulation of a system. More specifically, the latches (e.g., forming each register 306) in the programmable link delay logic 222 may create one or more link delays during the cycle simulation of the system, thereby creating a known skew between links during the simulation. For example, by adding the programmable link delay logic 222 to the MESA cycle simulator, the MESA cycle simulator may create a delay in one or more links so that a skew between links with a granularity of 1 simulator evaluation cycle may be formed.

The MESA cycle simulation tool may include a Broadband Engine Distribution (BED) partition or logic adapted to adjust for skew (e.g., wire delays) between links (e.g., byte links), thereby training the links. The known skew created by the programmable link delay logic 222 may be employed to verify proper functioning of such BED training logic.

The foregoing description discloses only exemplary embodiments of the invention. Modifications of the above disclosed apparatus and methods which fall within the scope of the invention will be readily apparent to those of ordinary skill in the art. For instance, although in the system 100 above data is transmitted to a processor 112, the present methods and apparatus may be employed to introduce delay in links which are employed to transmit data to any other device.

Accordingly, while the present invention has been disclosed in connection with exemplary embodiments thereof, it should be understood that other embodiments may fall within the spirit and scope of the invention, as defined by the following claims.

The invention claimed is:

1. A method of creating a programmable link delay during cycle simulation of a system, comprising:
   modeling a system for cycle simulation, wherein the system includes:
   a plurality of links;
   link transmitting logic adapted to transmit data on the plurality of links;
   link receiving logic adapted to receive data from the plurality of links; and
   link training logic coupled to the link receiving logic and adapted to compensate for skew between links; and
   employing delay logic, coupled to the plurality of links, in the modeled system to create a known skew between links during cycle simulation.

2. The method of claim 1 wherein employing delay logic in the modeled system to create a known skew between links during cycle simulation includes employing delay logic in the modeled system to create a programmable known skew between links during cycle simulation.

3. The method of claim 1 further comprising testing the link training logic using the known skew between links.

4. The method of claim 1 wherein employing delay logic in the modeled system to create a known skew between links during cycle simulation includes employing the delay logic to create a delay of at least one unit in one or more of the plurality of links during cycle simulation.

5. The method of claim 1 further comprising providing delay signals to the delay logic indicating respective delays to be applied to the plurality of links during cycle simulation;
   wherein employing delay logic in the modeled system to create a known skew between links during cycle simulation includes employing the delay logic to create the known skew between links during cycle simulation based on the delay signals.

6. The method of claim 1 further comprising transmitting a known test pattern from the link transmitting logic to the link receiving logic on each of the plurality of links;
   wherein employing delay logic in the modeled system to create a known skew between links during cycle simulation includes employing the delay logic in the modeled system to create the known skew between the test patterns received from the links during cycle simulation.

7. The method of claim 1 wherein the delay logic includes latches.

8. An apparatus for creating a programmable link delay during cycle simulation of a system, comprising:
   a computer; and
   a cycle simulation tool executed by the computer;
   wherein the cycle simulation tool is adapted to:
      model a system for cycle simulation, wherein the system includes:
         a plurality of links;
         link transmitting logic adapted to transmit data on the plurality of links;
         link receiving logic adapted to receive data from the plurality of links; and
         link training logic coupled to the link receiving logic and adapted to compensate for skew between links; and
      employ delay logic, coupled to the plurality of links, in the modeled system to create a known skew between links during cycle simulation.

9. The apparatus of claim 8 wherein the cycle simulation tool is further adapted to employ delay logic in the modeled system to create a programmable known skew between links during cycle simulation.

10. The apparatus of claim 8 wherein the cycle simulation tool is further adapted to test the link training logic using the known skew between links.

11. The apparatus of claim 8 wherein the cycle simulation tool is further adapted to employ the delay logic to create a delay of at least one unit in one or more of the plurality of links during cycle simulation.

12. The apparatus of claim 8 wherein the cycle simulation tool is further adapted to:
   receive delay signals in the delay logic indicating respective delays to be applied to the plurality of links during cycle simulation; and
   employ the delay logic to create the known skew between links during cycle simulation based on the delay signals.

13. The apparatus of claim 8 wherein the cycle simulation tool is further adapted to:
   transmit a known test pattern from the link transmitting logic to the link receiving logic on each of the plurality of links; and
   employ the delay logic in the modeled system to create the known skew between the test patterns received from the links during cycle simulation.

14. The apparatus of claim 8 wherein the delay logic includes latches.

15. A computer program product, comprising:
   a medium readable by a computer, the computer readable medium having computer program code adapted to:
      model a system for cycle simulation, wherein the system includes:
         a plurality of links;
         link transmitting logic adapted to transmit data on the plurality of links;
         link receiving logic adapted to receive data from the plurality of links; and
         link training logic coupled to the link receiving logic and adapted to compensate for skew between links; and
      employ delay logic, coupled to the plurality of links, in the modeled system to create a known skew between links during cycle simulation.

16. The computer program product of claim 15 wherein the computer program code is further adapted to employ delay logic in the modeled system to create a programmable known skew between links during cycle simulation.

17. The computer program product of claim 15 wherein the computer program code is further adapted to test the link training logic using the known skew between links.

18. The computer program product of claim 15 wherein the computer program code is further adapted to employ the delay logic to create a delay of at least one unit in one or more of the plurality of links during cycle simulation.

19. The computer program product of claim 15 wherein the computer program code is further adapted to:
   receive delay signals in the delay logic indicating respective delays to be applied to the plurality of links during cycle simulation; and
   employ the delay logic to create the known skew between links during cycle simulation based on the delay signals.

20. The computer program product of claim 15 wherein the computer program code is further adapted to:
   transmit a known test pattern from the link transmitting logic to the link receiving logic on each of the plurality of links; and
   employ the delay logic in the modeled system to create the known skew between the test patterns received from the links during cycle simulation.

* * * * *